US006867662B2

(12) United States Patent
Uriu et al.

(10) Patent No.: US 6,867,662 B2
(45) Date of Patent: Mar. 15, 2005

(54) HIGH-FREQUENCY SWITCH, LAMINATED HIGH-FREQUENCY SWITCH, HIGH-FREQUENCY RADIO UNIT, AND HIGH-FREQUENCY SWITCHING METHOD

(75) Inventors: Kazuhide Uriu, Katano (JP); Toru Yamada, Katano (JP); Tomoyuki Iwasaki, Joyo (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/463,005

(22) Filed: Jun. 17, 2003

(65) Prior Publication Data

US 2003/0214367 A1 Nov. 20, 2003

Related U.S. Application Data

(63) Continuation of application No. 10/034,879, filed on Dec. 26, 2001, now Pat. No. 6,606,015.

(30) Foreign Application Priority Data

Dec. 26, 2000 (JP) ....................................... 2000-394292

(51) Int. Cl.[7] ............................. H03H 7/46; H03H 7/48

(52) U.S. Cl. ........................ 333/132; 333/101; 333/193

(58) Field of Search ................................ 333/101, 126, 333/132, 143, 193

(56) References Cited

U.S. PATENT DOCUMENTS 3,768,043 A 10/1973 Foldes
5,933,770 A 8/1999 Heiter
6,388,537 B1 5/2002 Matsumoto

FOREIGN PATENT DOCUMENTS

EP 1 003 291 5/2000
EP 1 014 592 A2 6/2000
JP 2000-165274 6/2000

OTHER PUBLICATIONS

Communication Pursuant to Article 115(2) EPC for European Patent Application 01130694.1 (EP–A2–1223634), dated Feb. 11, 2004.

*Primary Examiner*—Robert Pascal
*Assistant Examiner*—Dean Takaoka
(74) *Attorney, Agent, or Firm*—RatnerPrestia

(57) ABSTRACT

A high-frequency switch has a first transmission-reception switching circuit for selectively switching between the signal transfer between an antenna terminal and a first transmitting-circuit terminal and the signal transfer between the antenna terminal and a first receiving-circuit terminal;

a second transmission-reception switching circuit for selectively switching between the signal transfer between the antenna terminal and a second transmitting-circuit terminal and the signal transfer between the antenna terminal and a second receiving-circuit terminal;

a first diplexer disposed between the antenna terminal and the first transmission-reception switching circuit and between the antenna terminal and the second transmission-reception switching circuit; and a second diplexer connected to the second receiving-circuit terminal to selectively switch the signal transfer between the second receiving-circuit terminal and a third receiving-circuit terminal and the signal transfer between the second receiving-circuit terminal and a fourth receiving-circuit terminal by using a phase-shifting circuit and a surface-acoustic-wave filter.

9 Claims, 10 Drawing Sheets

HIGH-FREQUENCY SWITCH, LAMINATED HIGH-FREQUENCY SWITCH, HIGH-FREQUENCY RADIO UNIT, AND HIGH-FREQUENCY SWITCHING METHOD

This application is a continuation of U.S. patent application Ser. No. 10/034,879, filed Dec. 26, 2001, now U.S. Pat. No. 6,606,015 B2.

DETAILED DESCRIPTION OF THE INVENTION

1. Field of the Invention

The present invention relates to a high-frequency switch used to switch between transmission and reception signals in a three-or four-frequency band of a portable telephone, a laminated high-frequency switch, a high-frequency radio unit, and a high-frequency switching method.

2. Related Art of the Invention

A conventional high-frequency switch for switching between transmission and reception signals in a three-frequency band, specifically EGSM transmission and reception signals in 900-MHz band, DCS transmission and reception signals in 1,800-MHz band, and PCS transmission and reception signals in 1,900-MHz band is described below with reference to the accompanying drawings.

FIG. 10 shows a conventional high-frequency switch for switching between frequency-band signals. As shown in FIG. 10, the conventional high-frequency switch is constituted by a first transmission-reception switching circuit 11, a second transmission-reception switching circuit 12, a diplexer 13, and an auxiliary switching circuit 14.

First, a diplexer 13 is described in accordance with FIG. 10. A low-pass filter for passing a low-frequency signal like a waveform 1 shown in FIG. 2 is formed by a fifth strip line L5, a sixth strip line L6, and a seventh capacitor C7 of the diplexer 13 and an attenuation pole A is formed by the fact that the sixth strip line L6 and the seventh capacitor C7 constitute a series circuit which is connected to the earth side. Moreover, a high-pass filter for passing a high-frequency signal like a waveform 2 shown in FIG. 2 is formed by a thirteenth capacitor C13, an eleventh strip line L11, and a fourteenth capacitor C14 and an attenuation pole B is formed by the fact that the eleventh strip line L11 and fourteenth capacitor C14 constitute a series circuit which is connected to the earth side.

By realizing the connection with an antenna through the low-pass filter or high-pass filter, when transmitting or receiving a low-frequency signal (EGSM signal in 900-MHz band) the high-pass filter side preferably obtains isolation against a low-frequency signal from a point C by the attenuation pole B and therefore, no signal leaks to the high-pass filter side. Moreover, when transmitting or receiving a high-frequency signal, the low-pass filter side obtains isolation from the point C against a high frequency by the attenuation pole A and therefore, no signal leaks to the low-pass filter side. That is, the diplexer 13 has a function for branching a low-frequency signal and a high-frequency signal.

The first transmission-reception switching circuit 11 is described below. When transmitting a low frequency, by applying a positive voltage to a control terminal Vc1, a first diode P1 and a second diode P2 are turned on. In this case, because a first capacitor C1, a fourth capacitor C4, a sixth capacitor C6, and the thirteenth capacitor C13 prevent DC components, no DC current flows through each terminal. Because the impedance of a third strip line L3 infinitely increases when the second diode P2 is connected to the earth side, a signal sent from a transmitting-circuit terminal Tx1 is not transferred to a receiving-circuit terminal Rx1. In this case, because the inductance component of the second diode P2 resonates with a fifth capacitor C5, it is possible to infinitely increase the impedance when viewing a receiving circuit from a point A at the frequency of a transmission signal and therefore, the transmission signal is sent to an antenna terminal ANT by passing through the low-pass filter of the diplexer 13.

When performing reception by the first transmission-reception switching circuit 11, no DC voltage is applied to the control terminal Vc1. Therefore, because the first diode P1 and second diode P2 are turned off, a reception signal is transferred from the antenna terminal ANT to the receiving-circuit terminal Px1. In this case, by resonating the capacitance component of the first diode P1 with the second strip line L2 in order to avoid the influence of the capacitance component of the first diode P1, it is possible to preferably obtain the isolation of the transmitting-circuit terminal Tx1 from the point A at a reception frequency of the reception signal and transfer a reception signal from the antenna terminal ANT to the receiving-circuit terminal Rx1 through a low-pass filter.

The second transmission-reception switching circuit 12 is a circuit for transmitting or receiving frequency signals having a frequency higher than the case of the first transmission-reception switching circuit 11 (DCS signal in 1,800-MHz band and PCS signal in 1,900-MHz band). The circuit configuration of the second transmission-reception switching circuit 12 is completely the same as that of first transmission-reception switching circuit 11. Therefore, when transmitting a high frequency, by applying a positive voltage to a control terminal Vc2, a transmission signal is transferred from the transmitting-circuit terminal Tx2 to the antenna terminal ANT through the high-pass filter of the diplexer 13. When receiving a high-frequency signal, by applying no positive voltage to the control terminal Vc2, it is possible to transfer a reception signal from the antenna terminal ANT to the receiving-circuit terminal Rx2 through the high-pass filter of the diplexer 13.

An auxiliary switching circuit 14 is a circuit for transferring a high-frequency reception signal input from the receiving-circuit terminal Rx2 of the second transmission-reception switching circuit 12 to the point D of the auxiliary switching circuit 14 by further switching the signal to receiving-circuit terminals Rx3 (PCS receiving terminal) and Rx4 (DCS receiving terminal) in two frequency bands different from each other. The configuration of the auxiliary switching circuit 14 is basically the same as those of the first transmission-reception switching circuit 11 and second transmission-reception switching circuit 12. Therefore, by applying a positive voltage to a control terminal Vc3, a reception signal is transferred from the receiving-circuit terminal Rx2 of the second transmission-reception switching circuit 12 to the third receiving-circuit terminal Rx3 via the point D of the auxiliary switching circuit 14. When no positive voltage is applied to the control terminal Vc2 of the second transmission-reception switching circuit 12 but a positive voltage is applied to the control terminal Vc3 of the auxiliary switching circuit 14, a high-frequency reception signal is transferred to the third receiving-circuit terminal Rx3 via the high-pass filter of the diplexer 13, the point B of the second transmission-reception switching circuit 12, and the point D of the auxiliary switching circuit 14.

When no voltage is applied to the control terminal Vc3 of the auxiliary switching circuit 14, the reception signal is transferred from the receiving-circuit terminal Rx2 of the second transmission-reception switching circuit 12 to the fourth receiving-circuit terminal Rx4 via the point D of the auxiliary switching circuit 14. When no positive voltage is applied to the control terminal Vc2 of the second transmission-reception switching circuit 12 and moreover, no voltage is applied to the control terminal Vc3 of the auxiliary switching circuit 14, the high-frequency reception signal is transferred to the fourth receiving-circuit terminal Rx4 via the high-pass filter of the diplexer 13, the point B of the second transmission-reception switching circuit 12, and the point D of the auxiliary switching circuit 14.

A conventional high-frequency switch thus switches between transmission and reception signals in three types of frequency bands.

However, because a conventional high-frequency switch is used for a portable telephone as described above, it is indispensable that the switch will be further downsized. Therefore, it is strongly requested to reduce the number of components to be mounted on the surface of a laminated-substrate constituting a high-frequency switch.

Moreover, in the case of an auxiliary switching circuit, it is necessary to apply a control voltage (standby voltage) to the control terminal Vc3 in order to receive reception signals in two types of frequency bands in one third receiving-circuit terminal Rx3. The present inventor perceives that power is consumed by applying the above control voltage.

SUMMARY OF THE INVENTION

The present invention is made to solve the above conventional problems and its object is to provide a high-frequency switch, a laminated high-frequency switch, and a high-frequency radio unit for reducing the number of components to be mounted on the surface of a laminated substrate for the high-frequency switch.

Moreover, it is another object of the present invention to provide a high-frequency switch, a laminated high-frequency switch, a high-frequency radio unit, and a high-frequency switching method for reducing the power consumption of the high-frequency switch.

One aspect of the present invention is a high-frequency switch comprising:

a first transmission-reception switching circuit for selectively switching between the signal transfer between an antenna terminal and a first transmitting-circuit terminal and the signal transfer between the antenna terminal and a first receiving-circuit terminal;

a second transmission-reception switching circuit for selectively switching between the signal transfer between the antenna terminal and a second transmitting-circuit terminal and the signal transfer between the antenna terminal and a second receiving-circuit terminal;

a first diplexer disposed between the antenna terminal and the first transmission-reception switching circuit and between the antenna terminal and the second transmission-reception switching circuit; and a second diplexer connected to the second receiving-circuit terminal to selectively switch the signal transfer between the second receiving-circuit terminal and a third receiving-circuit terminal and the signal transfer between the second receiving-circuit terminal and a fourth receiving-circuit terminal by using a phase-shifting circuit and a surface-acoustic-wave filter.

Another aspect of the present invention is the high-frequency switch, wherein the first diplexer has a low-pass filter disposed between the antenna terminal and the first transmission-reception switching circuit and a high-pass filter disposed between the antenna terminal and the second transmission-reception switching circuit.

Still another aspect of the present invention is the high-frequency switch, wherein the first transmission-reception switching circuit has a first diode having an anode connected to the first transmitting-circuit terminal and a cathode connected to the low-pass filter, a first strip line connected at one end to the anode of the first diode and grounded at the other end through a first capacitor and connected to a first control terminal, a second diode having an anode connected to the first receiving-circuit terminal and a cathode grounded through a parallel circuit constituted by a second capacitor and a second strip line, and a third strip line connected at one end to the anode of the second diode and connected at the other end to the low-pass filter;

the second transmission-reception switching circuit has a third diode having an anode connected to the second transmitting-circuit terminal and a cathode connected to the high-pass filter, a fourth strip line connected at one end to the anode of the third diode and grounded at the other end through a third capacitor and connected to a second control terminal, a fourth diode having an anode connected to the second receiving-circuit terminal and a cathode grounded through a parallel circuit constituted by a fourth capacitor and a fifth strip line, and a sixth strip line connected at one end to the anode of the fourth diode and connected at the other end to the high-pass filter;

the second diplexer has a phase-shifting circuit whose input terminal is connected to the second receiving-circuit terminal, whose first output terminal is connected to a third receiving-circuit terminal through a first surface-acoustic-wave filter, and whose second output terminal is connected to a fourth receiving-circuit terminal through a second surface-acoustic-wave filter; and transmission and reception are switched in accordance with a voltage applied to the first or second control terminal.

Yet still another aspect of the present invention is the high-frequency switch, further comprising:

a first balanced-to-unbalanced converter disposed between the first output terminal of the phase-shifting circuit and the first surface-acoustic-wave filter; and a second balanced-to-unbalanced converter disposed between the second output terminal of the phase-shifting circuit and the second surface-acoustic-wave filter.

Still yet another aspect of the present invention is the high-frequency switch, further comprising:

a third balanced-to-unbalanced converter disposed between the anode of the second diode and the first receiving-circuit terminal; and a third surface-acoustic wave filter disposed on the output side of the third balanced-to-unbalanced converter.

A further aspect of the present invention is the high-frequency switch, wherein the phase-shifting circuit has a seventh strip line connected at one end to the second receiving-circuit terminal and connected at the other end to the first surface-acoustic-wave filter, a fifth capacitor connected at one end to the second receiving-circuit terminal and grounded at the other end through a first inductor, and a sixth capacitor grounded at one end through the first inductor and connected to the fifth capacitor and connected at the other end to the second surface-acoustic-wave filter.

A still further aspect of the present invention is the high-frequency switch, wherein the phase-shifting circuit has a second inductor grounded at one end through a seventh capacitor and connected to the second receiving-circuit terminal and connected at the other end to the first surface-acoustic-wave filter, an eighth capacitor connected at one end to the second receiving-circuit terminal and grounded at the other end through a third inductor, and a ninth capacitor grounded at one end through the third inductor and connected to the eighth capacitor and connected at the other end to the second surface-acoustic-wave filter.

A Yet further aspect of the present invention is the high-frequency switch comprising:

a first transmission-reception switching circuit for selectively switching between the signal transfer between an antenna terminal and a first transmitting-circuit terminal and the signal transfer between the antenna terminal and a first receiving-circuit terminal;

a second transmission-reception switching circuit for selectively switching between the signal transfer between the antenna terminal and a second transmitting-circuit terminal and the signal transfer between the antenna terminal and a second receiving-circuit terminal;

a first diplexer disposed between the antenna terminal and the first transmission-reception switching circuit and between the antenna terminal and the second transmission-reception switching circuit; and a second diplexer connected to the second receiving-circuit terminal to selectively switch the signal transfer between the second receiving-circuit terminal and a third receiving-circuit terminal and the signal transfer between the second receiving-circuit terminal and a fourth receiving-circuit terminal by using a phase-shifting-circuit and a surface-acoustic-wave filter; and a third diplexer connected to the first receiving-circuit terminal in order to selectively switch the signal transfer between the first receiving-circuit terminal and a fifth receiving-circuit terminal and the signal transfer between the first receiving-circuit terminal and a sixth receiving-circuit terminal by using a phase-shifting circuit and a surface-acoustic-wave filter.

A still yet further aspect of the present invention is a laminated high-frequency switch using the high-frequency switch, wherein at least one of the surface-acoustic-wave filter, the diode and the capacitor is mounted on the laminate.

An additional aspect of the present invention is a laminated high-frequency switch using the high-frequency switch, wherein lamination is provided in such a manner that a ground electrode is positioned between (a) the seventh strip line, and (b) the first inductor, the fifth capacitor, and the sixth capacitor.

A still additional aspect of the present invention is a high-frequency radio unit comprising:

a transmitting circuit for performing transmission;

a receiving circuit for performing reception; and the high-frequency switch

A yet additional aspect of the present invention is a high-frequency switching method comprising:

a step of selectively switching between the signal transfer between an antenna terminal and a first transmitting-circuit terminal and the signal transfer between the antenna terminal and a first receiving-circuit terminal by using a first transmission-reception switching circuit;

a step of selectively switching between the signal transfer between the antenna terminal and a second transmitting-circuit terminal and the signal transfer between the antenna terminal and a second receiving-circuit terminal by using a second transmission-reception switching circuit;

a step of selectively switching between the signal transfer between the antenna terminal and the first transmission-reception switching circuit and the signal transfer between the antenna terminal and the second transmission-reception switching circuit by using a first diplexer; and a step of selectively switching between the signal transfer between the second receiving-circuit terminal and a third receiving-circuit terminal and the signal transfer between the second receiving-circuit terminal and a fourth receiving-circuit terminal by using a second diplexer having a phase-shifting circuit and a surface-acoustic-wave filter and connected to the second receiving-circuit terminal.

A still yet additional aspect of the present invention is a high-frequency switching method comprising:

a step of selectively switching between the signal transfer between an antenna terminal and a first transmitting-circuit terminal and the signal transfer between the antenna terminal and a first receiving-circuit terminal by using a first transmission-reception switching circuit;

a step of selectively switching between the signal transfer between the antenna terminal and a second transmitting-circuit terminal and the signal transfer between the antenna terminal and a second receiving-circuit terminal by using a second transmission-reception switching circuit;

a step of selectively switching between the signal transfer between the antenna terminal and the first transmission-reception switching circuit and the signal transfer between the antenna terminal and the second transmission-reception switching circuit by using a first diplexer; and a step of selectively switching between the signal transfer between the second receiving-circuit terminal and a third receiving-circuit terminal and the signal transfer between the second receiving-circuit terminal and a fourth receiving-circuit terminal by using a second diplexer having a phase-shifting circuit and a surface-acoustic-wave filter and connected to the second receiving-circuit terminal; and a step of selectively switching between the signal transfer between the first receiving-circuit terminal and a fifth receiving-circuit terminal and the signal transfer between the first receiving-circuit terminal and a sixth receiving-circuit terminal by using a third diplexer having a phase-shifting circuit and a surface-acoustic-wave filter and connected to the first receiving-circuit terminal.

The entire disclosure of U.S. patent application Ser. No. 10/034,879, tiled Dec. 26, 2001, is expressly incorporated by reference herein,

DETAILED DESCRIPTION OF THE INVENTION

Embodiments of the present invention are described below with reference to the accompanying drawings.

(Embodiment 1)

Figure 1:
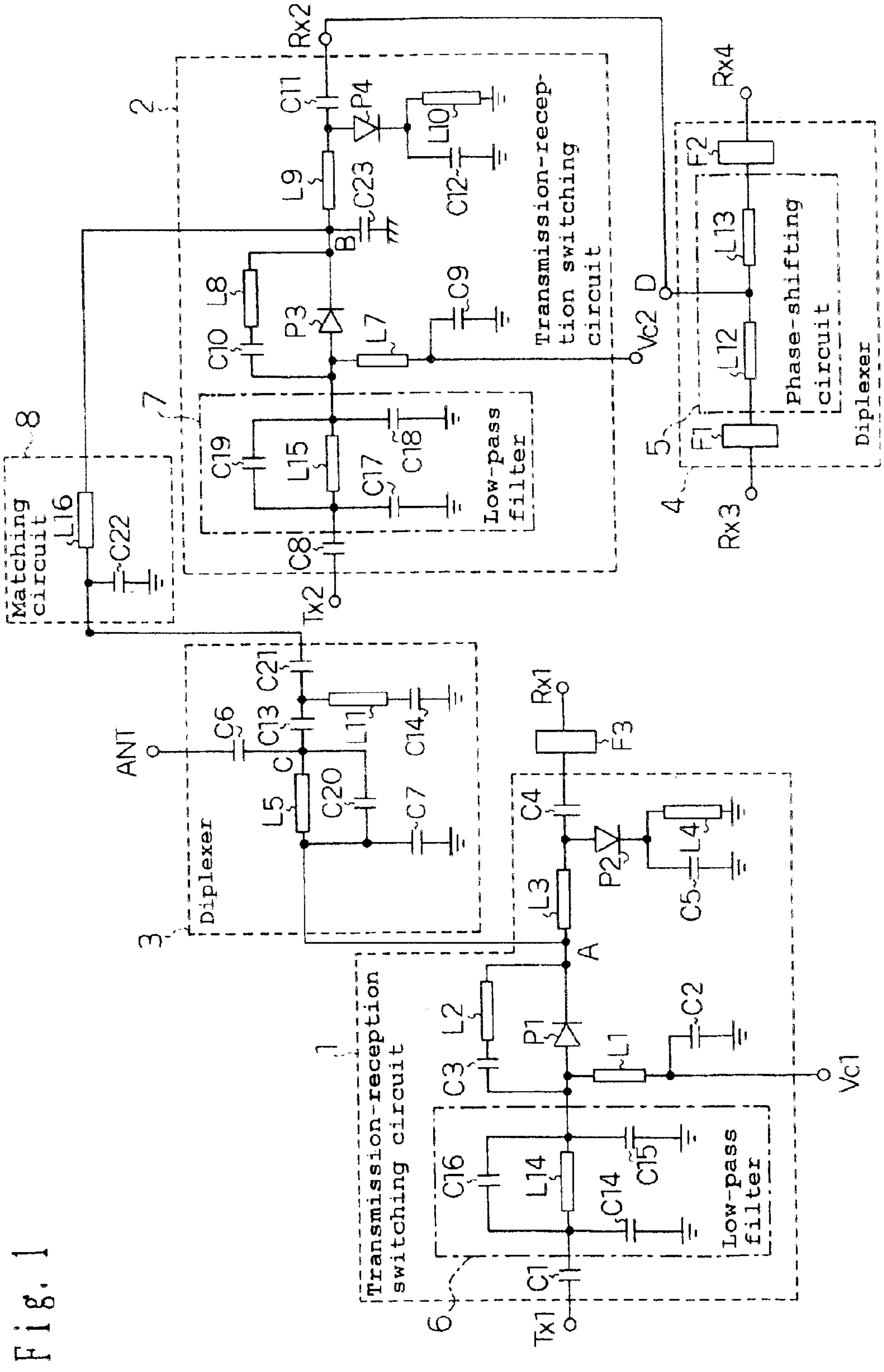
FIG. 1 is a circuit diagram of the high-frequency switch in the first embodiment of the present invention.

First, a configuration of the high-frequency switch in a first embodiment of the present invention is described below mainly with reference to FIG. 1 showing a circuit diagram of the high-frequency switch in this embodiment.

In FIG. 1, a first transmission-reception switching circuit 1 switches between transmission and reception of a low-frequency-band signal (as specific example, EGSM signal in 900-MHz band) In the case of the first transmission-reception switching circuit 1, the anode of the first diode P1 is connected to the transmitting-circuit terminal Tx1 through the first capacitor C1 and a low-pass filter 6 and the cathode of the first diode P1 is connected to the point A. Moreover, one end of the first strip line L1 is connected to the joint between the first diode P1 and the low-pass filter 6 and the other end of the first strip line L1 is connected to the control terminal Vc1. Furthermore, the other end of the first strip line L1 is connected to an earth through the second capacitor C2. Furthermore, the series circuit comprising the second strip line L2 and the third capacitor C3 are connected to the first diode P1 in parallel. The control terminal Vc1 serves as an input terminal for a control signal for switching between a transmission signal and a reception signal of the first transmission-reception switching circuit 1.

The low-pass filter 6 is constituted by a parallel circuit comprising a fourteenth strip line L14 and a sixteenth capacitor C16, a fourteenth capacitor for connecting one end of the fourteenth strip line L14 to an earth, and a fifteenth capacitor C15 for connecting the other end of the fourteenth strip line L14 to an earth.

Moreover, the anode of the second diode P2 is connected to the receiving-circuit terminal Rx1 of the first transmission-reception switching circuit 1 through a series circuit comprising a surface-acoustic-wave filter (hereafter referred to as SAW filter) F3 and the fourth capacitor C4. The cathode of the second diode P2 is connected to an earth through a parallel circuit comprising a fourth strip line L4 and the fifth capacitor C5. One end of the third-strip line L3 is connected to the anode of the second diode P2 and the other end of the third strip line L3 is connected to the point A.

The point A of the first transmission-reception switching circuit 1 is connected to a parallel circuit comprising the fifth strip line L5 of the first diplexer 3 and a twentieth capacitor C20 and the fifth strip line L5 and the other end of the twentieth capacitor C20 are connected to the antenna terminal ANT via the point C through the sixth capacitor C6. Moreover, one end of the fifth strip line L5 is connected to an earth through the seventh capacitor C7. In this case, the fifth strip line L5 of the first diplexer 3, the twentieth capacitor C20, and the seventh capacitor C7 constitute a low-pass filter. Moreover, the point C of the first diplexer 3 is connected to a matching circuit 8 through the thirteenth capacitor C13 and a twenty-first capacitor C21.

The second transmission-reception switching circuit 2 switches between transmission and reception of high-frequency-band signals (as specific examples, DCS signal in 1,800-MHz band and PCS signal in 1,900-MHz band) The anode of a third diode P3 is connected to the transmitting-circuit terminal Tx2 of the second transmission-reception switching circuit 2 through an eighth capacitor C8 and a low-pass filter 7 and the cathode of the third diode P3 is connected to the point B. Moreover, one end of a seventh strip line L7 is connected to the joint between the anode of the third diode P3 and the low-pass filter 7 and the other end of the seventh strip line L7 is connected to the control terminal Vc2. Furthermore, the other end of the seventh strip line L7 is connected to an earth through a ninth capacitor C9. A series circuit comprising an eighth strip line L8 and a tenth capacitor C10 is connected to the third diode P3 in parallel. The control terminal Vc2 serves as an input terminal for a control signal for switching between a transmission signal and a reception signal of the second transmission-reception switching circuit 2.

In the case of the second transmission-reception switching circuit 2, the anode of a fourth diode P4 is connected to receiving-circuit terminal Rx2 through an eleventh capacitor C11 and the cathode of the fourth diode P4 is connected to an earth through a parallel circuit comprising a tenth strip line L10 and a twelfth capacitor C12. One end of a ninth strip line L9 is connected to the anode of the fourth diode P4 and the other end of the ninth strip line L9 is connected to the point B.

The point B of the second transmission-reception switching circuit 2 is connected to the thirteenth capacitor C13 of the first diplexer 3 via the matching circuit 8 and to the antenna terminal ANT through the sixth capacitor C6 by passing through the point C. One end of the thirteenth capacitor C13 is connected to an earth through a series circuit comprising the eleventh strip line L11 and the fourteenth capacitor C14. The thirteenth capacitor C13 of the first diplexer 3, eleventh strip line L11, and fourteenth capacitor C14 constitute a high-pass filter.

A second diplexer 4 is constituted by a phase-shifting circuit 5 comprising strip lines L12 and L13, an SAW filter F1, and a SAW filter F2, in which the point D is connected to the receiving-circuit terminal Rx2 of the second transmission-reception switching circuit 2, the input terminal of the phase-shifting circuit 5 is connected to the point D, and the first output terminal of the phase-shifting circuit 5 is connected to the third receiving-circuit terminal Rx3 (PCS receiving terminal) through the first SAW filter F1.

Moreover, the second output terminal of the phase-shifting circuit 5 is connected to the fourth receiving-circuit terminal Rx4 (DCS receiving terminal) through the second SAW filter F2.

The matching circuit 8 is provided to match the impedance of the second transmission-reception switching circuit 2 with that of the first diplexer 3 and one end of a sixteenth strip line L16 is grounded through a twenty-second capacitor C22. The other end of the sixteenth strip line L16 is connected to the point B grounded through a twenty-third capacitor C23 of the second transmission-reception switching circuit 2.

In the case of this embodiment, the matching circuit 8 is not indispensable but it is sufficient to provide the circuit 8 when it is necessary to match impedances. Of course, the sixteenth strip line L16 or twenty-second capacitor C22 is unnecessary unless the matching circuit 8 is set.

The antenna terminal ANT corresponds to an antenna terminal of the present invention. Moreover, the transmitting-circuit terminal Tx1 corresponds to a first transmitting-circuit terminal of the present invention, the receiving-circuit terminal Rx1 corresponds to a first receiving-circuit terminal of the present invention, and the first transmission-reception switching circuit 1 corresponds to a first transmission-reception switching circuit of the present invention. Moreover, the transmitting-circuit terminal Tx2 corresponds to a second transmitting-circuit terminal of the present invention, the receiving-circuit terminal Rx2 corresponds to a second receiving-circuit terminal of the present invention, the second transmission-reception switching circuit 2 corresponds to a second transmission-reception switching circuit of the present invention. Furthermore, the first diplexer 3 corresponds to a first diplexer of the present invention. Furthermore, the phase-shifting circuit 5 corresponds to a phase-shifting circuit of the present invention, the receiving-circuit terminal Rx3 corresponds to a third receiving-circuit terminal of the present invention, the receiving-circuit terminal Rx4 corresponds to a fourth receiving-circuit terminal of the present invention, and the second diplexer 4 corresponds to a second diplexer of the present invention.

Furthermore, means including the fifth strip line L5, seventh capacitor C7, and twentieth capacitor C20 corresponds to a low-pass filter disposed between an antenna terminal and a first transmission-reception switching circuit of the present invention. Means including the thirteenth capacitor C13, fourteenth capacitor C14, twenty-first capacitor C21, and eleventh strip line L11 correspond to a high-pass filter disposed between an antenna terminal and a second transmission-reception switching circuit of the present invention.

Furthermore, the first diode P1 corresponds to a first diode of the present invention, the second capacitor C2 corresponds to a first (sic) capacitor of the present invention, the control terminal Vc1 corresponds to a first control terminal of the present invention, the first strip line L1 corresponds to a first strip line of the present invention, the fifth capacitor C5 corresponds to a second capacitor of the present invention, the fourth strip line L4 corresponds to a second strip line of the present invention, the second diode P2 corresponds to a second diode of the present invention, and the third strip line L3 corresponds to a third strip line of the present invention.

Moreover, the third diode P3 corresponds to a third diode of the present invention, the ninth capacitor C9 corresponds to a third capacitor of the present invention, the control terminal Vc2 corresponds to a second control terminal of the present invention, the seventh strip line L7 corresponds to a fourth strip line of the present invention, the twelfth capacitor C12 corresponds to a fourth capacitor of the present invention, the tenth strip line L10 corresponds to a fifth strip line of the present invention, the fourth diode P4 corresponds to a fourth diode of the present invention, and the ninth strip line L9 corresponds to a sixth strip line of the present invention.

Furthermore, the first SAW filter F1 corresponds to a first surface-acoustic-wave filter of the present invention, the second SAW filter F2 corresponds to a second surface-acoustic-wave filter of the present invention, and the third SAW filter F3 corresponds to a third surface-acoustic-wave filter of the present invention.

Then, operations of the high-frequency switch in this embodiment are described below. While describing operations of the high-frequency switch in this embodiment, an embodiment of a high-frequency switching method of the present invention is also described (the same is true for the following embodiments).

Figure 2:
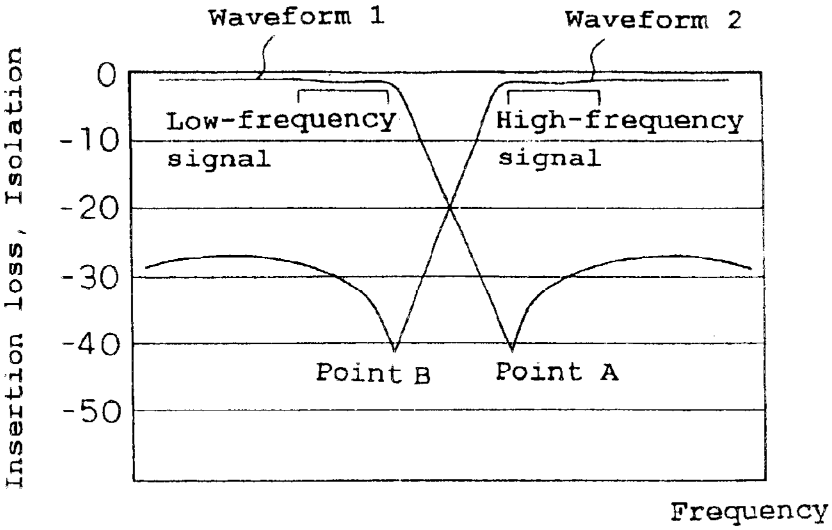
FIG. 2 is a characteristic diagram showing the passing characteristic of the first diplexer of a high-frequency switch of the present invention.

A low-pass filter for passing a signal in a low frequency band like the waveform 1 shown in FIG. 2 is formed by the fifth strip line L5, seventh capacitor C7, and twentieth capacitor C20 of the first diplexer 3 in FIG. 1 and an attenuation pole A is formed by a parallel circuit comprising the fifth strip line L5 and twentieth capacitor C20. Moreover, a high-pass filter for passing a signal in a high frequency band like the waveform 2 shown in FIG. 2 is formed by the thirteenth capacitor C13, eleventh strip line L11, and fourteenth capacitor C14 and an attenuation pole B is formed by constituting a series circuit by the eleventh strip line L11 and fourteenth capacitor C14 connected to the earth side.

When transmitting or receiving a signal in a low frequency band by connecting it to an antenna through the above low-pass filter or high-pass filter, the high-pass filter preferably obtains an isolation for a low-frequency signal from the point C by the attenuation pole B and therefore, no signal leaks to the high-pass filter. Moreover, when transmitting or receiving a signal in a high frequency band, the low-pass filter preferably obtains an isolation from the point C for a high frequency by the attenuation pole A and therefore, no signal leaks to the low-pass filter. That is, the first diplexer 3 has a function for branching a low-frequency signal and a high-frequency signal.

The first transmission-reception switching circuit 1 is described below. When performing low-frequency transmission, by applying a positive voltage to the control terminal Vc1, the first diode P1 and second diode P2 are turned on. In this case, because the first capacitor C1, fourth capacitor C4, sixth capacitor C6, and thirteenth capacitor C13 prevent DC components, no DC current leaks to each terminal. Because the second diode P2 is connected to an earth, the impedance of the third strip line L3 infinitely increases. Therefore, a signal sent from the transmitting-circuit terminal Tx1 is not transferred to the receiving-circuit terminal Rx1. Because the inductance component of the second diode P2 resonates with the fifth capacitor C5, it is possible to infinitely increase the impedance when viewing the receiving-circuit terminal Rx1 from the point A at the frequency of a transmission signal. The transmission signal is sent to the antenna terminal ANT by passing through the low-pass filter of the first diplexer 3 via the point A.

The low-pass filter 6 of the first transmission-reception switching circuit 1 prevents the harmonic component contained in a transmission signal from being transferred to the antenna terminal ANT. Because a transmission signal of the first transmission-reception switching circuit 1 is sent to the antenna terminal ANT by passing through the low-pass filter of the first diplexer 3, the low-pass filter 6 is not absolutely necessary. However, the filter 6 is used to further secure the effect of preventing the harmonic component.

When the first transmission-reception switching circuit 1 performs reception, no DC voltage is applied to the control terminal Vc1. Therefore, because the first diode P1 and second diode P2 are turned off, a reception signal is transferred to the receiving-circuit terminal Rx1 via the point A from the antenna terminal ANT. In this case, by resonating the capacitance component of the first diode P1 with the second strip line L2 in order to avoid the influence of the capacitance component of the first diode P1, it is possible to make an isolation from the point A to the transmitting-circuit terminal Tx1 preferable at the reception frequency of a reception signal and transfer the reception signal from the antenna terminal ANT to the receiving-circuit terminal Rx1 through the low-pass filter of the first diplexer 3.

The second transmission-reception switching circuit 2 is a circuit for transmitting or receiving a signal in a frequency band higher than that of the first transmission-reception switching circuit 1. Though the circuit configuration of the second transmission-reception switching circuit 2 is completely the same as that of the first transmission-reception switching circuit 1, the second transmission-reception switching circuit 2 is described below according to the accompanying drawings.

When transmitting a high frequency, the third diode P3 and fourth diode P4 are turned on by applying a positive voltage to the control terminal Vc2. In this case, because the eighth capacitor C8, eleventh capacitor C11, thirteenth capacitor C13, and sixth capacitor C6 prevent DC components, no DC current flows through each terminal. Because the fourth diode P4 is connected to an earth and thereby, the impedance of the ninth strip line L9 infinitely increases, a signal sent from the transmitting-circuit terminal Tx2 is not transferred to the receiving-circuit terminal Rx2. Because the inductance component of the fourth diode P4 resonates with the twelfth capacitor C12, it is possible to infinitely increase the impedance when viewing the receiving-circuit terminal Rx2 from the point B at the frequency of a transmission signal. The transmission signal is sent to the antenna terminal ANT via the point B by passing through the matching circuit 8 and the high-pass filter of the first diplexer 3.

The low-pass filter 7 of the second transmission-reception switching circuit 2 prevents the harmonic component contained in a transmission signal from being transferred to the antenna terminal ANT. Because a transmission signal of the second transmission-reception switching circuit 2 is sent to the antenna terminal ANT by passing through the high-pass filter of the first diplexer 3 instead of passing through the low-pass filter of the circuit 3, it is preferable to use the low-pass filter 7 unless a transmission circuit takes secure measures for harmonics.

When the second transmission-reception circuit 2 performs reception, no DC voltage is applied to the control terminal Vc2. Therefore, because the third diode P3 and fourth diode P4 are turned off, a reception signal is transferred to the receiving-circuit terminal Rx2 via the high-pass filter of the first diplexer 3, matching circuit 8, and point B from the antenna terminal ANT. In this case, by resonating the capacitance component of the third diode P3 with the eighth strip line L8 in order to avoid the influence of the capacitance component of the third diode P3, it is possible to make the isolation from the point B to the transmitting-circuit terminal Tx2 at the reception frequency of a reception signal preferable and transfer the reception signal to the receiving-circuit terminal Rx2 from the antenna terminal ANT through the high-pass filter of the first diplexer 3 and the matching circuit 8.

The second diplexer 4 is described below. In FIG. 1, the point D is connected to the second receiving-circuit terminal Rx2 of the second transmission-reception switching circuit 2. The input terminal of the phase-shifting circuit 5 is connected to the point D and the first output terminal of the phase-shifting circuit 5 is connected to the third receiving-circuit terminal Rx3 through the first SAW filter F1. A band-pass filter for passing a reception signal in a second reception band, specifically, a DCS-signal receiving band in 1,800-MHz band is constituted by the phase-shifting circuit 5 and first SAW filter F1 to pass only a reception signal in a low frequency band out of two types of high-band-frequency reception signals. The second output terminal of the phase-shifting circuit 5 is connected to the fourth receiving-circuit terminal Rx4 through the second SAW filter F2. A band-pass filter for passing a reception signal in a third reception band, specifically, a PCS reception band in 1,900-MHz band is constituted by the phase-shifting circuit 5 and second SAW filter F2 to pass only a reception signal in a high frequency band out of two types of high-band-frequency reception signals.

Figure 3:
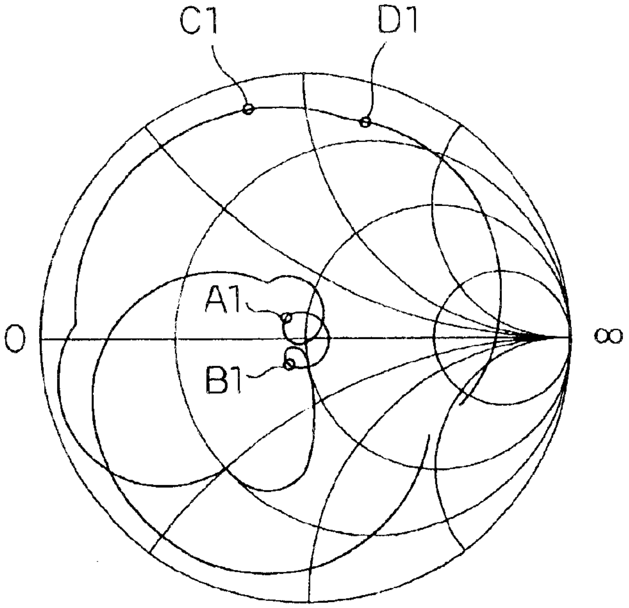
FIG. 3 is a Smith chart showing the impedance characteristic of a single SAW filter.

Operations of the second diplexer are described below using the accompanying drawings. First, the impedance during only the first SAW filter F1 is described below using FIG. 3. FIG. 3 is a Smith chart showing the switch of impedances between the points D at the both ends of the single first SAW filter F1 and the terminal Rx3 when using a signal frequency as a parameter. In FIG. 3, the section along the curve between the points A1 and B1 on curves is a pass band of the first SAW filter F1, that is, the DCS side in 1,800-MHz band. The impedance characteristic in FIG. 3 shows that the DCS-side pass band is present at almost the center of the Smith chart, the voltage standing-wave ratio (VSWR) is almost equal to 1, and the first SAW filter F1 matches with the impedance of a line. Therefore, it is possible to pass a DCS signal in 1,800-MHz band at a small loss.

The section along the curve between the points C1 and D1 on the curve is the pass band of the opposite side, that is, the PCS side in 1,900-MHz band. Though the pass band in the PCS band is separate from the central portion of the Smith chart to the upper side of the chart, it is also separate from the right side of the chart that is a high-impedance area. This represents that the first SAW filter F1 does not have an impedance high enough to prevent a PCS signal in 1,900-MHz band from passing. Therefore, in the case of the single first SAW filter E1, it is difficult to pass a signal in a DCS band in 1,800-MHz band and obtain a wave-filtering characteristic enough to prevent the PCS signal in 1,900-MHz band.

Figure 4:
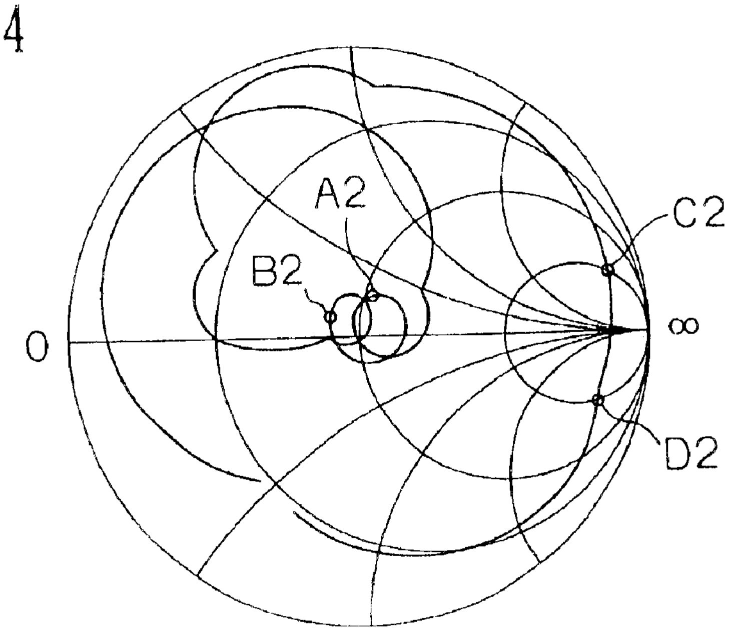
FIG. 4 is a Smith chart showing the impedance characteristic of a combined circuit of a phase-shifting circuit and SAW filters.
Figure 5:
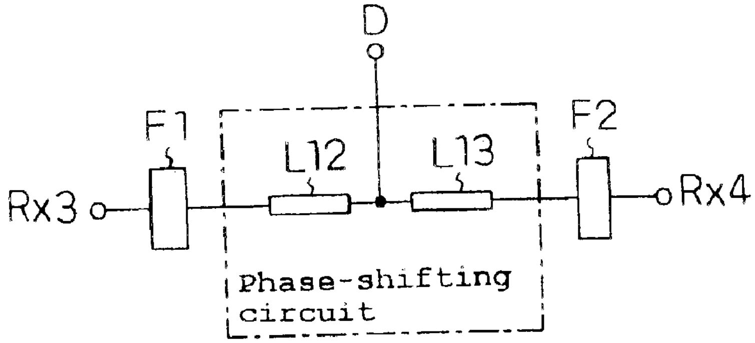
FIG. 5 is a circuit diagram of a second diplexer constituted by a phase-shifting circuit and SAW filters.

FIG. 4 shows the impedance characteristic when using a signal frequency as a parameter in a diplexer in which the first output terminal of the phase-shifting circuit 5 and the first SAW filter F1 of the present invention are connected each other. FIG. 5 is a local circuit diagram in which the first output terminal of the phase-shifting circuit 5 and the first SAW filter F1 of the present invention are connected each other and the second output terminal of the phase-shifting circuit 5 and one end of the second SAW filter are connected each other. The input terminal of the phase-shifting circuit 5 is connected to the point D, the other end of the first SAW filter F1 is connected to the terminal Rx3, and the other end of the second SAW filter F2 is connected to the terminal Rx4.

The Smith chart in FIG. 4 shows the impedance between the point D and the terminal Rx3 shown in FIG. 5. That is, the impedance curve in the case of the single SAW filter F1 shown in FIG. 3 has a shape shown in FIG. 4 because a phase is rotated by the phase-shifting circuit 5. In FIG. 4, the section along the curve between the points A2 and B2 on the curve is the pass band of the DCS side in 1,800-MHz band. Though the shape of the curve of the pass band of the DCS side slightly changes from that in FIG. 3, it is located at almost the center of the chart, the voltage standing-wave ratio (VSWR) is almost equal to 1, and it is shown that the series circuit comprising the phase-shifting circuit 5 and first SAW filter F1 connected between the point D and the terminal Rx3 matches with the impedance of a line.

The section along the curve between the points C2 and D2 on the curve is the pass band of the PCS side in a 1,900 MHz band, in which the phase is rotated by the first phase-shifting circuit 5 and the pass band of the PCS side moves to a very-high-impedance area at the right side of the chart. This shows that a circuit in which the phase-shifting circuit 5 is connected with the SAW filter F1 passes signals of the DCS side in 1,800-MHz band at a small loss while almost completely preventing signals of the PCS side in 1,900-MHz band. That is, by setting the phase-shifting circuit 5 to the input side of the SAW filter F1, it is possible to form an ideal filter circuit for passing signals of the DCS side in 1,800-MHz band and preventing signals of the PCS side in 1,900-MHz band.

A case is described above in which a DCS band is used as a bass band and a PCS band is prevented. Moreover, a circuit in which a PCS band in 1,900-MHz band is used as a pass band and a DCS band in 1,800-MHz band is prevented and the second output terminal of the phase-shifting circuit 5 is connected with the second SAW filter F2 can be similarly described with FIGS. 3 and 4 when replacing the DCS band with the PCS band.

That is, because the first SAW filter F1 is different from the second SAW filter F2 in pass band, the shape of a curve on a Smith chart is slightly changed. However, the position of the pass band of the PCS side in 1,900-MHz band is brought to almost the center of the Smith chart and the position of the pass band of the DCS side in 1,800-MHz band is separate from the center of the Smith chart. Also in this case, because the pass band of the DCS in 1,800-MHz band is separate from the right side of the Smith chart having a high impedance, the filtering characteristic of passing only PCS signals in 1,90-MHz band and sufficiently preventing DCS signals in 1,800-MHz band cannot be not obtained. Therefore, by connecting the second phase-shifting circuit 5 to the input side of the second SAW filter F2 and thereby rotating a phase, it is possible to move the pass band of the DCS side in 1,800-MHz band to the right side of the Smith chart serving as a high impedance area and thereby, a characteristic for preventing DCS signals in 1,800-MHz band is obtained.

That is, by connecting the second output terminal of the phase-shifting circuit 5 to the input terminal of the second SAW filter F2, it is possible to form an ideal filter circuit for passing signals of the PCS side in 1,900-MHz band and preventing signals of the DCS side in 1,800-MHz band.

As shown in FIGS. 1 and 5, it is possible to securely separate DCS signals in 1,800-MHz band from PCS signals in 1,900-MHz band by the second diplexer 4 in which the input terminal of the first phase-shifting circuit 5 is connected to the point D, the first output terminal of the phase-shifting circuit is connected to the third receiving-circuit terminal Rx3 through the first SAW filter F1, and the second output terminal of the phase-shifting circuit 5 is connected to the receiving-circuit terminal Rx4 through the second SAW filter F2.

This embodiment is described in accordance with a phase-shifting circuit having a common input terminal and two output terminals constituted by two strip lines L12 and L13. A second diplexer of the present invention is not restricted to the above configuration. Though the phase-shifting circuit 5 is described above by using a circuit constituted by strip lines as an example, a phase-shifting circuit can be constituted by various configurations. Therefore, a phase-shifting circuit of the present invention is not restricted to a circuit constituted by strip lines.

Figure 11B:
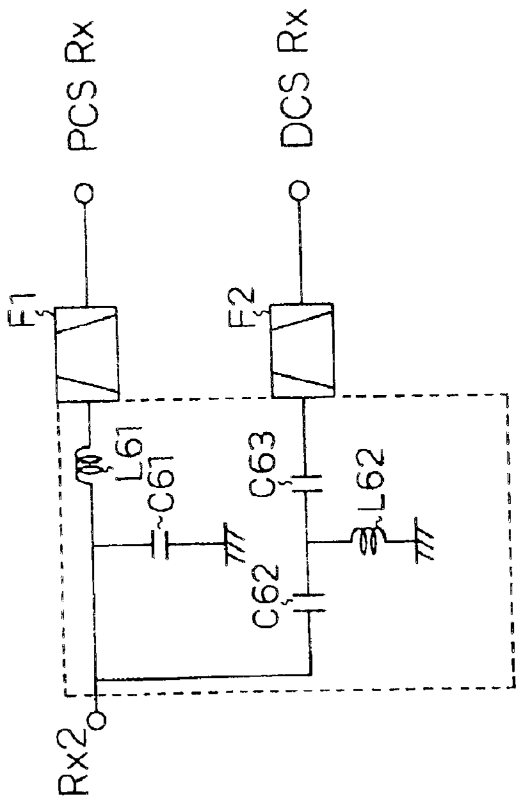
FIG. 11B is a circuit diagram of a phase-shifting circuit (2) of the high-frequency switch in the first embodiment of the present invention.
Figure 11A:
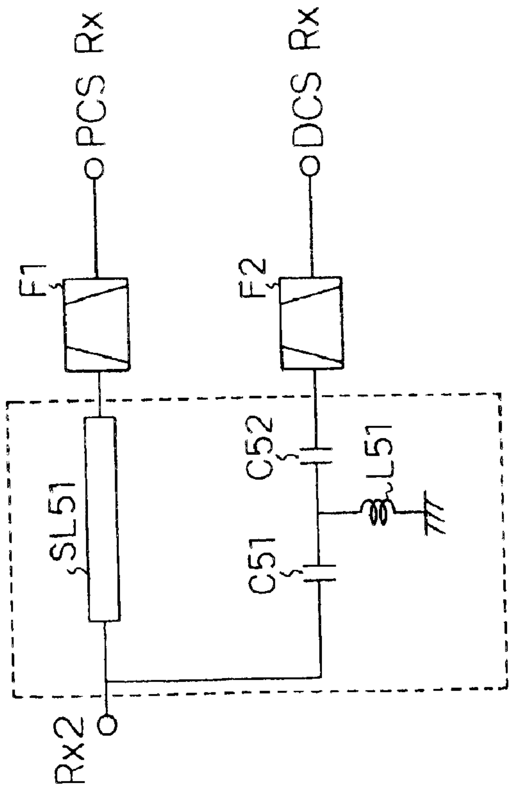
FIG. 11A is a circuit diagram of a phase-shifting circuit (1) of the high-frequency switch in the first embodiment of the present invention.
Figure 12:
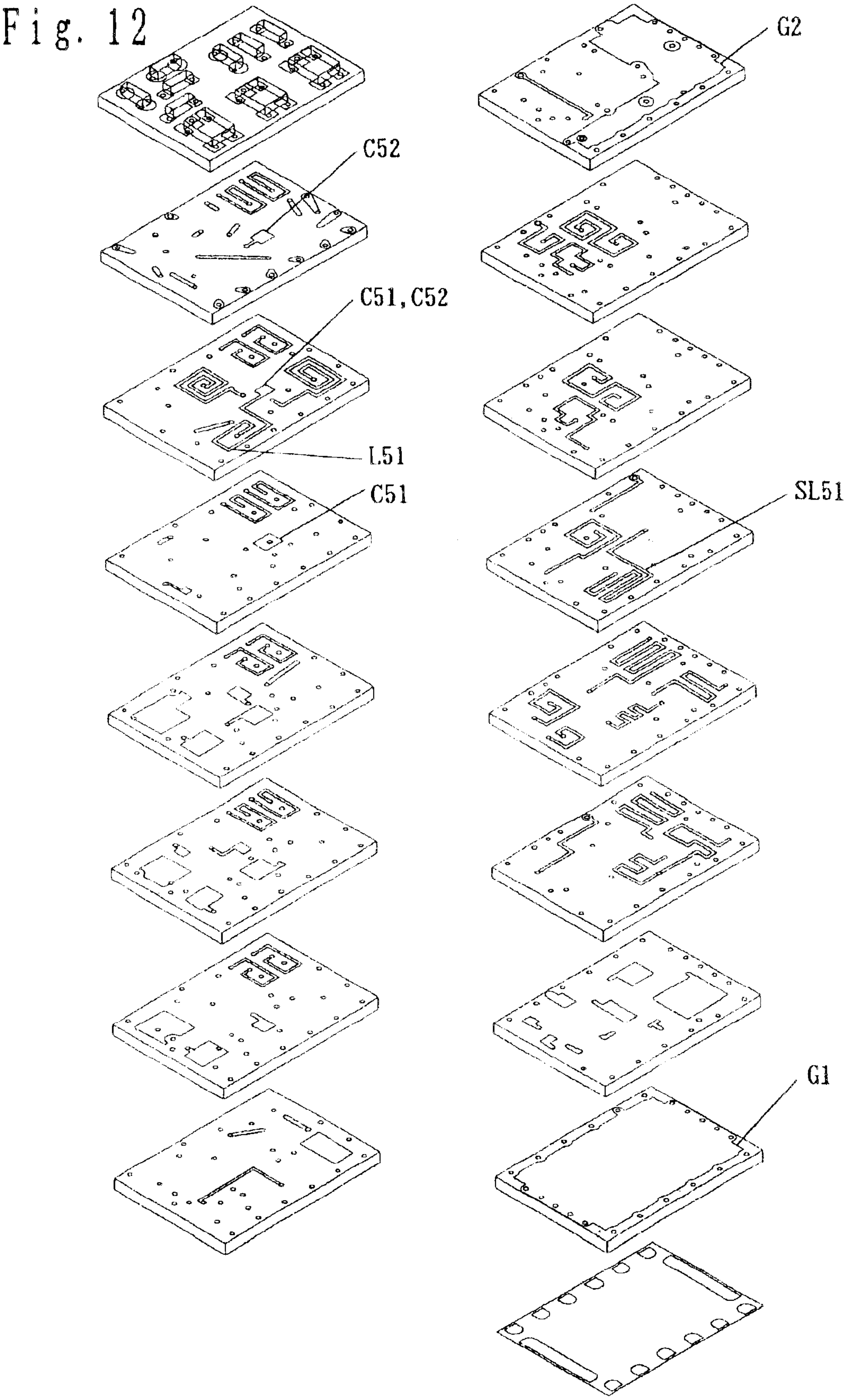
FIG. 12 is an exploded perspective view of a laminated high-frequency switch of the present invention for explaining a mounting structure using the phase-shifting circuit (1) of the high-frequency switch in the first embodiment.

For example, as shown in FIG. 11A, it is also allowed that a phase-shifting circuit has a strip line SL51 connected at one end to the second receiving-circuit terminal Rx2 (refer to FIG. 1) and connected at the other end to the SAW filter F1, a capacitor C51 connected at one end to the second receiving-circuit terminal Rx2 and grounded at the other end through an inductor L51, and a capacitor C52 grounded at one end through the inductor L51 and connected to the capacitor C51 and connected at the other end to the SAW filter F2 (the laminated structure of a laminated high-frequency switch using the above phase-shifting circuit will be described later) By using a 50-Ω line as the strip line SL51, it is possible to realize the above phase rotation without switching the shape of an impedance curve nearby the central portion of a Smith chart (for example, refer to FIG. 4). The strip line SL51 corresponds to the seventh strip line of the present invention, the inductor L51 corresponds to the first inductor of the present invention, the capacitor C51 corresponds to the fifth capacitor of the present invention, and the capacitor C52 corresponds to the sixth capacitor of the present invention.

Moreover, as shown in FIG. 11B, it is allowed that a phase-shifting circuit has an inductor L61 grounded at one end through a capacitor C61 and connected to the second receiving-circuit terminal Rx2 and connected at the other end to the SAW filter F1, a capacitor C62 connected at one end to the receiving-circuit terminal Rx2 and grounded at the other end through an inductor L62, and a capacitor C63 grounded at one end through the inductor L62 and connected to the capacitor C62 and connected at the other end to the SAW filter F2. The capacitor C61 corresponds to the seventh capacitor of the present invention, the inductor L61 corresponds to the second inductor of the present invention, the inductor L62 corresponds to the third inductor of the present invention, the capacitor C62 corresponds to the eighth capacitor of the present invention, and the capacitor C63 corresponds to the ninth capacitor of the present invention.

According to the above-described first embodiment of the present invention, because the diplexer 4 is used which distinguishes between signals in two frequency bands as a circuit characteristic instead of the auxiliary switching circuit 14 for switching between signals in two frequency bands through control differently from the case of a conventional high-frequency switch, it is possible to reduce the number of components to be mounted on the surface of a laminated substrate constituting a high-frequency switch and omit two diodes which particularly require mounting spaces and to which a standby voltage must be applied. Moreover, because reception signals of two different high-frequency bands are switched by the phase-shifting circuit 5 of the second diplexer 4 and the surface-acoustic-wave filters F1 and F2, it is unnecessary to control the second diplexer 4 by applying a control voltage to the circuit 4 from an external unit and unnecessary to apply a standby voltage even under reception standby. Therefore, it is possible to reduce power consumption.

For this embodiment, a case is described in which a first diplexer is constituted by a low-pass filter and a high-pass filter. However, this embodiment is not restricted to the above case. It is also possible to realize this embodiment by using a band-pass filter having the same pass band as a low-pass filter or high-pass filter.

(Second Embodiment)

Figure 6:
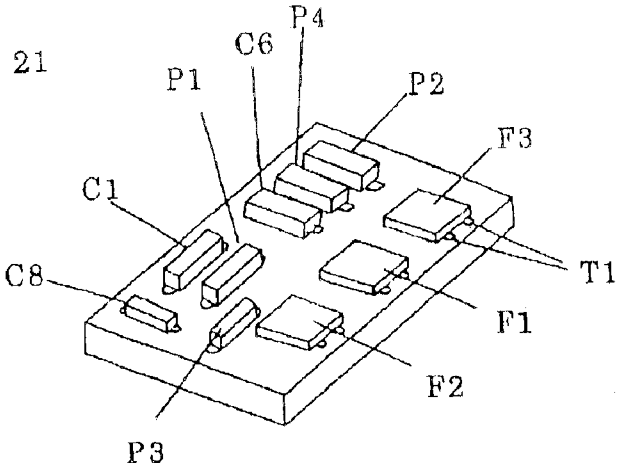
FIG. 6 is an outline perspective view for explaining a structure of the high-frequency switch in the first embodiment of the present invention.

Then, a configuration and operations of the laminated high-frequency switch in a second embodiment of the present invention mainly with reference to FIG. 6 which is an exploded perspective view of the laminated high-frequency switch in the embodiment 2 of the present invention. The structure of the high-frequency switch in the above first embodiment is also described below.

FIG. 6 shows a laminate using the high-frequency switch in the first embodiment. Three SAW filters F1, F2, and F3 and four diodes P1 to P4, and capacitors C1, C6, and C8 respectively having a comparatively large capacity are mounted on the upper face of a laminated high-frequency switch 21 having a multilayer structure in which various strip lines and capacitors constituting the high-frequency switch are built through terminals T1 formed on the upper face of the laminated high-frequency switch 21 and electrically connected to internal circuits of the laminated high-frequency switch 21.

Figure 7:
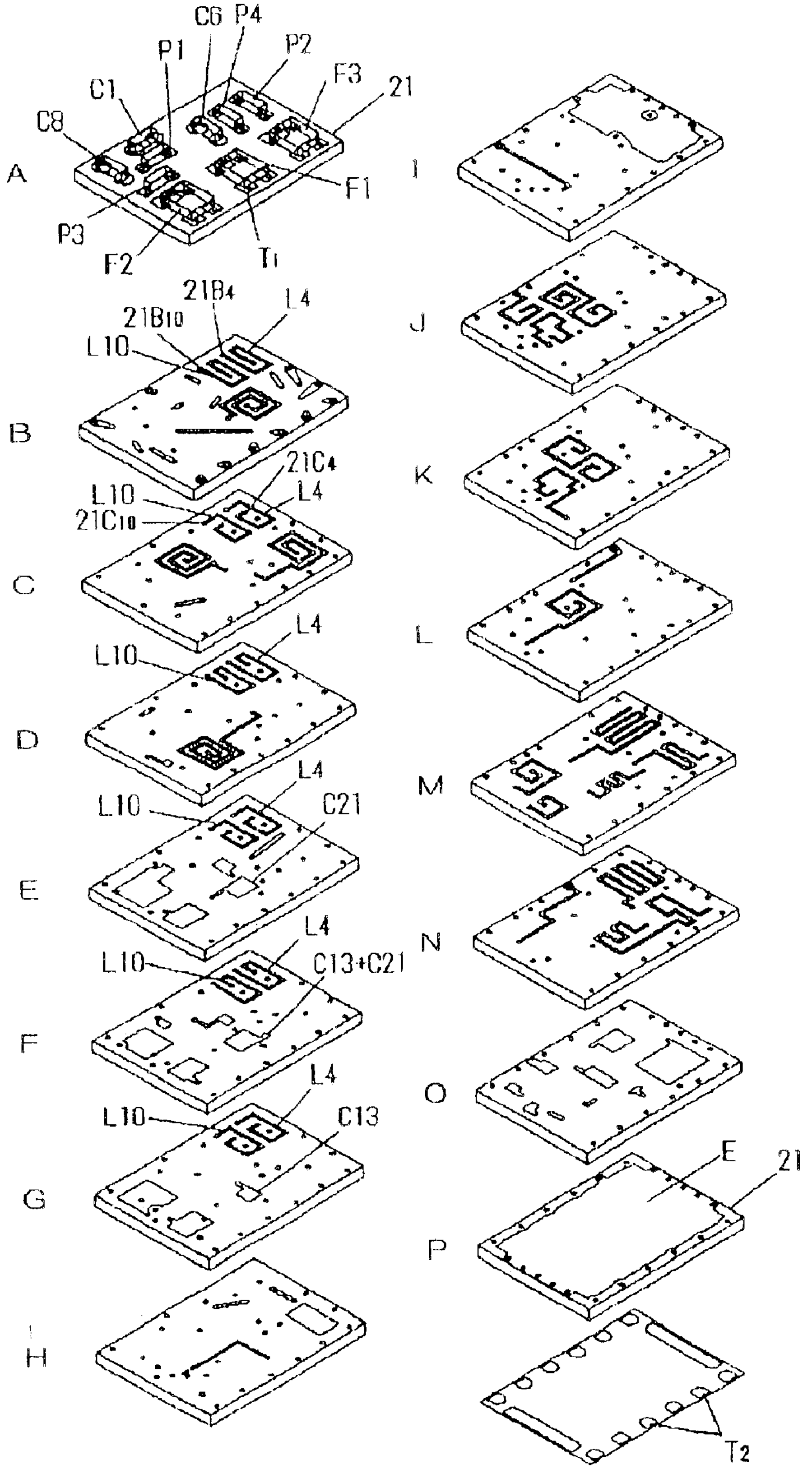
FIG. 7 is an exploded perspective view of a laminated high-frequency switch in the second embodiment of the present invention for explaining a structure using the high-frequency switch in the first embodiment.

FIG. 7 is an exploded perspective view of the above laminated high-frequency switch 21. As shown in FIG. 7, the high-frequency switch in this embodiment is constituted by 16-layer dielectric substrates 21A to 21P and the laminated number of dielectric substrates is not restricted to the configuration in this embodiment but it is properly selected in accordance with a characteristic required for the high-frequency switch.

A dielectric substrate can use the so-called glass-ceramics substrate obtained by adding low-melting glass frit to ceramic powder such as forsterite. Many via holes for electrically connecting multilayer wirings each other are drilled on a green sheet obtained by forming the slurry obtained by adding an organic binder and an organic solvent to the ceramic powder by means of punching or laser working.

Then, strip lines L1 to L14 and capacitor electrodes C1 to C23 shown in FIG. 1 are printed on predetermined green sheets by using conductive paste whose conductive material mainly contains silver, gold, or copper powder to form a wiring pattern and printing-inject the same conductive paste into via holes for inter-layer-connecting the wiring pattern of each green sheet.

It is possible to obtain a laminate integrated by accurately aligning the green sheets of 16 layers thus obtained and laminating them and humidifying and pressuring the laminate under a certain condition. Then, the laminated high-frequency switch 21 can be obtained by drying the above obtained laminate, then baking the laminate in a kiln having an oxidation atmosphere at approx. 400 to 500° C. to burn out the organic binder in the green sheets, then baking the laminate in the normal air when using silver or gold powder as the main component of a conductive material or in an inert-gas atmosphere or a reducing atmosphere in a temperature range of approx. 850 to 950° C. when using copper powder.

A plurality of terminals T1 for mounting SAW filters and diodes are provided on the upper face of the dielectric substrate 21A and a plurality of terminals T2 for mounting a high-frequency switch of the present invention on the surface of the main substrate of electronic units are provided on the back of the dielectric substrate 21P on whose surface an earth electrode E is formed by printing and patterning the above conductive paste.

Then, the laminated structure of the wiring pattern of a high-frequency switch having the multilayer structure thus constituted is briefly described below by illustrating the fourth and tenth strip lines and the thirteenth and twenty-first capacitors.

As shown in FIG. 7, the tenth strip line L10 and the fourth strip line L4 are constituted by successively connecting the lines L10 and L4 over six layers to the strip line patterns on the dielectric substrate 21G through via holes respectively so that strip line patterns on the dielectric substrate 21B are inter-layer-connected to strip line patterns on the dielectric substrate 21C through via holes 21$B_{10}$ and 21$B_4$ and strip line patterns on the dielectric substrate 21C are inter-layer-connected to strip line patterns on the dielectric substrate 21D through via holes 21$C_{10}$ and 21$C_4$.

Moreover, the thirteenth capacitor C13 and twenty-first capacitor C21 are constituted in series by providing the electrode pattern of the twenty-first capacitor C21 for the dielectric substrate 21E and the electrode pattern shared by the thirteenth capacitor C13 and twenty-first capacitor C21 for the dielectric substrate 21F, and then the electrode pattern of the thirteenth capacitor C13 for the dielectric substrate 21G.

Because other strip lines and capacitors are constituted in the same manner as the above, their detailed description is omitted. However, because all input/output terminals of the high-frequency switch in this embodiment are collected on the back of the dielectric substrate 21P through via holes, it is possible to decrease the mounting area of the high-frequency switch when mounting the switch on the main substrate of an electronic unit.

In the case of a laminated high-frequency switch using a high-frequency switch having the phase-shifting circuit shown in FIG. 11A, it is allowed that (a) the strip line SL51, and (b) the inductor L51, capacitor C51, and capacitor C52 are laminated so that a ground electrode G2 is located between them. More specifically, in the case of the above laminated structure, the strip line SL51 is disposed between ground electrodes G1 and G2 and the inductor L51, capacitor C51, and capacitor C52 are arranged on the upper layer of the ground electrode G2. Because inter-device combination is suppressed between the strip line SL51 on one hand and remaining devices such as the inductor L51, capacitor C51, and capacitor C52 on the other in accordance with the presence of a ground electrode, characteristics of a phase-shifting circuit are sufficiently demonstrated.

(Third Embodiment)

Figure 8:
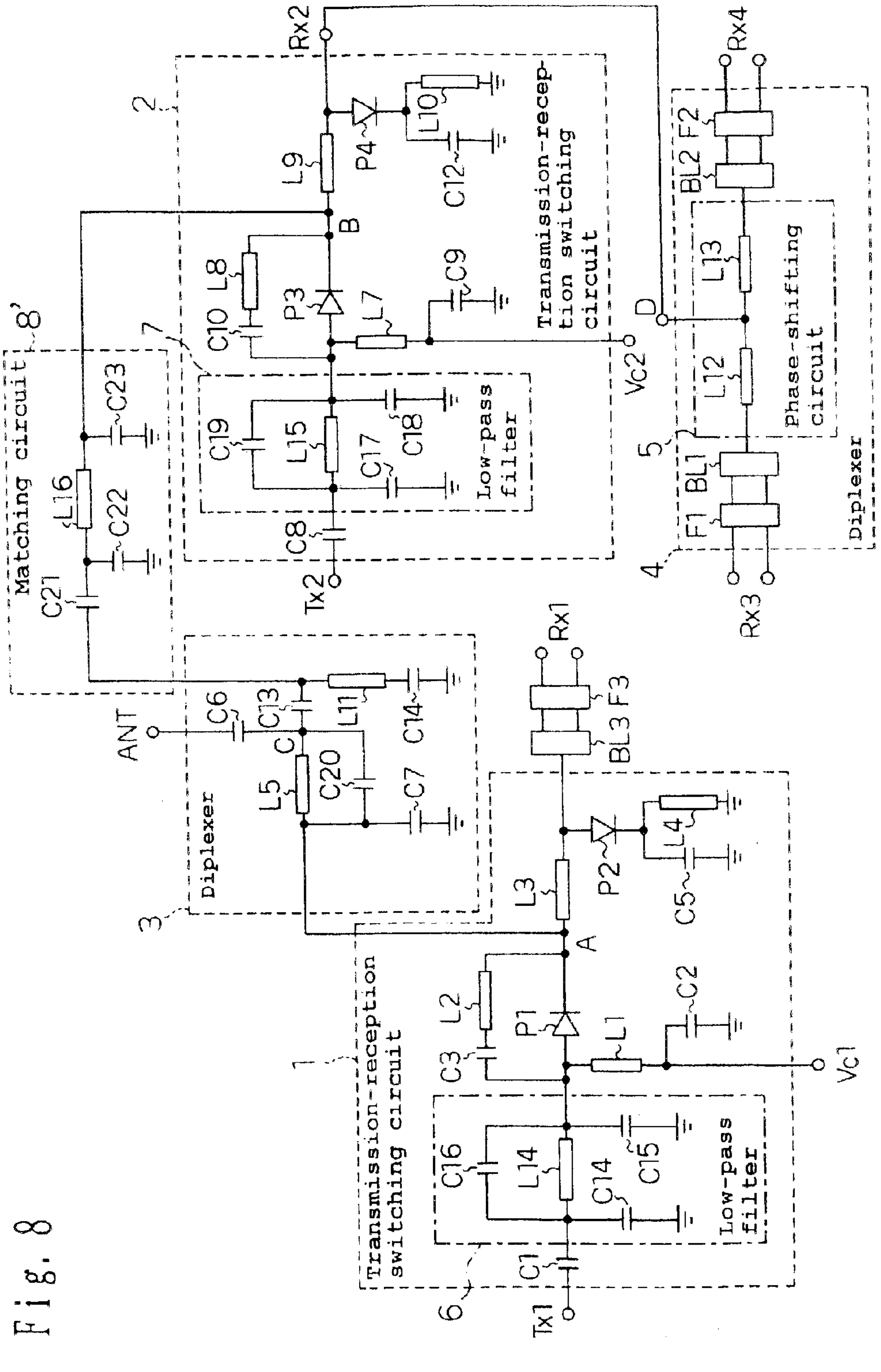
FIG. 8 is a circuit diagram of the high-frequency switch in the third embodiment of the present invention.

Then, a configuration and operations of the high-frequency switch in a third embodiment of the present invention are described mainly with reference to FIG. 8 showing a circuit diagram of the high-frequency switch in this embodiment. Because the circuit diagram shown in FIG. 8 is basically the same as the circuit diagram in the first embodiment shown in FIG. 1, points different from the configuration shown in FIG. 1 are described below.

As shown in FIG. 8, balanced-to-unbalanced converters BL1 and BL2 (hereafter respectively referred to as balun) are connected between the first output terminal of the phase-shifting circuit 5 of the second diplexer 4 and the first SAW filter F1 and between the second output terminal of the phase-shifting circuit 5 of the diplexer 4 and the second SAW filter F2. Moreover, a balun is disposed at the input side of the SAW filter F3 connected to the first receiving-circuit terminal Rx1, that is, between the anode of the second diode P2 of the first transmission-reception switching circuit 1 and the SAW filter F3.

Figure 9:
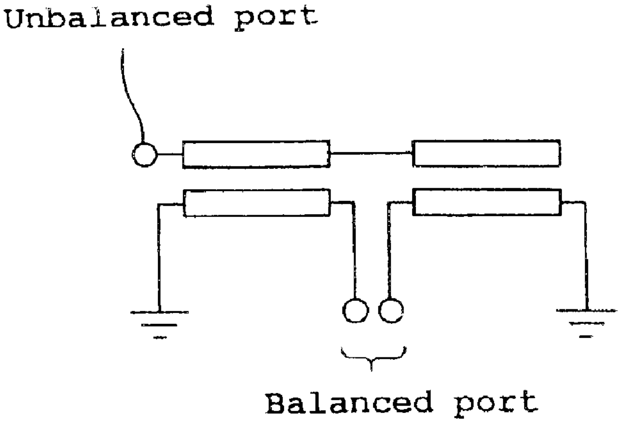
FIG. 9 is an equivalent-circuit diagram of a balanced-to-unbalanced converter.
Figure 10:
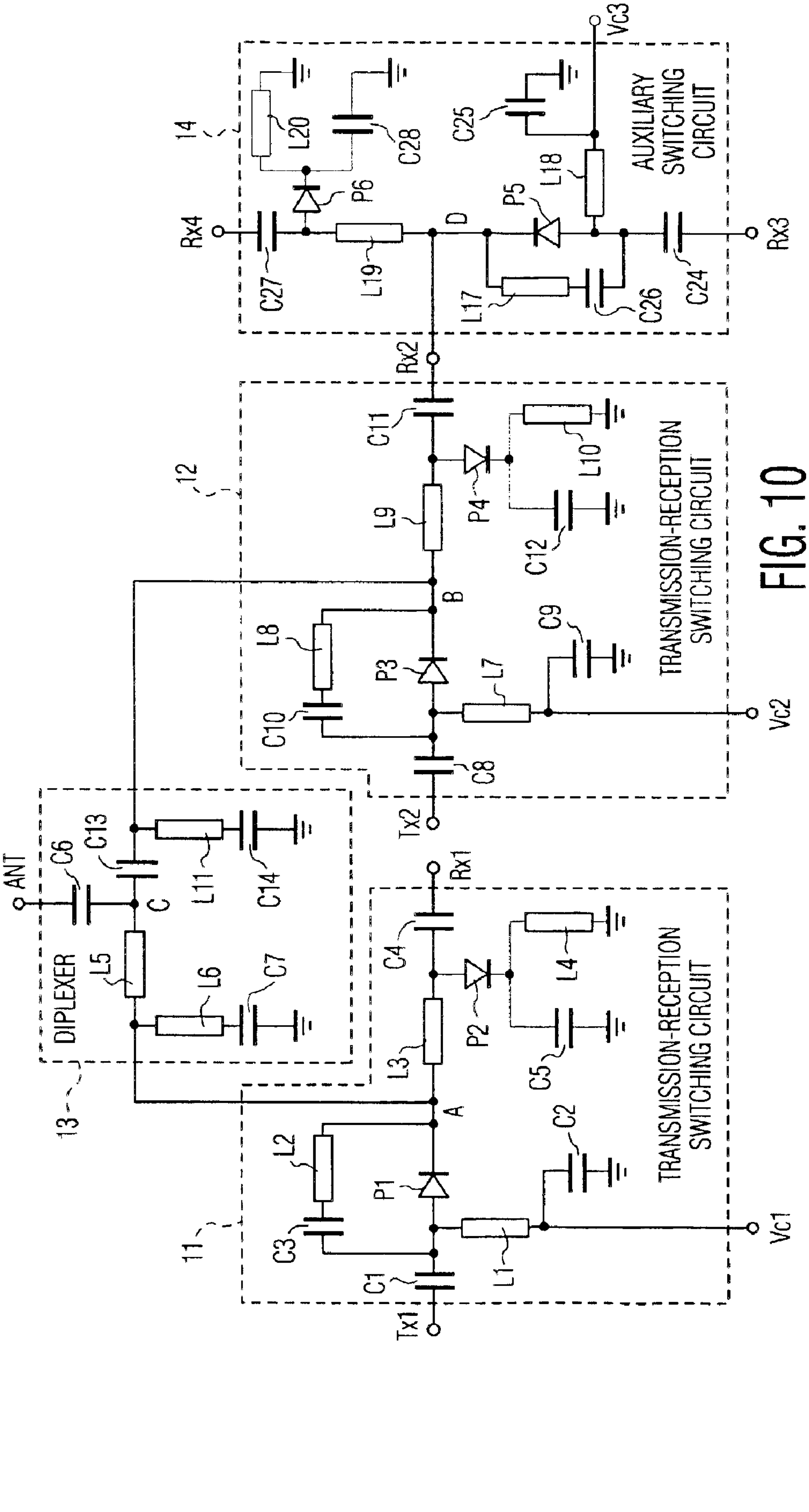
FIG. 10 PRIOR ART
FIG. 10 is a circuit diagram of a conventional high-frequency switch.

FIG. 9 shows an equivalent circuit of a balun. When a signal is input to an unbalanced port of the balun, a balanced output of the signal is obtained from a balanced port. Thus, by using a balun, it is possible to convert an output signal of a receiving-circuit terminal into a balanced output by a simple circuit configuration and realize a circuit configuration strong for noises. Moreover, because a balun is constituted as shown in FIG. 9, it is possible to omit DC-cutoff capacities for cutting off a DC connected to the receiving-circuit terminals Rx1 and Rx2, that is, it is possible to omit the fourth capacitor C4 and eleventh capacitor C11 shown in FIG. 1 in order to cut off a DC.

The balanced-to-unbalanced converter BL1 correspond to the first balanced-to-unbalanced converter of the present invention and the balanced-to-unbalanced converter BL2 corresponds to the second balanced-to-unbalanced converter of the present invention. Moreover, the balun disposed between the anode of the second diode P2 of the first transmission-reception switching circuit 1 and the SAW filter F3 corresponds to the third balanced-to-unbalanced converter of the present invention.

Of curse, the configuration of the high-frequency switch in the third embodiment can be formed by a configuration same as the case of the second embodiment.

The embodiments 1 to 3 are described above in detail. The present invention includes a high-frequency switch provided with (1) a first transmission-reception switching circuit for selectively switching between the signal transfer between an antenna terminal and a first transmitting-circuit terminal and the signal transfer between the antenna terminal and a first receiving-circuit terminal, (2) a second transmission-reception switching circuit for selectively switching between the signal transfer between the antenna terminal and a second transmitting-circuit terminal and the signal transfer between the antenna terminal and a second receiving-circuit terminal, (3) a first diplexer disposed between the antenna terminal and the first transmission-reception switching circuit and between the antenna terminal and the second transmission-reception switching circuit, (4) a second diplexer connected to the second receiving-circuit terminal in order to selectively switch the signal transfer between the second receiving-circuit terminal and a third receiving-circuit terminal and the signal transfer between the second receiving-circuit terminal and a fourth receiving-circuit terminal by using a phase-shifting circuit and a surface-acoustic-wave filter, and (5) a third diplexer connected to the first receiving-circuit terminal in order to selectively switch the signal transfer between the first receiving-circuit terminal and a fifth receiving-circuit terminal and the signal transfer between the first receiving-circuit terminal and a sixth receiving-circuit terminal by using the phase-shifting circuit and the surface-acoustic-wave filter. This type of the high-frequency switch has a configuration in which a diplexer similar to the diplexer 4 (refer to FIG. 1) is connected to the receiving-circuit terminal Rx1 (refer to FIG. 1) of the high-frequency switch in the embodiment 1 described above as the above third diplexer, which can be used for a portable telephone corresponding to four bands capable of branching four frequencies.

Diplexer 4*a* may include any of the previously enclosed embodiments of diplexer 4 shown in FIG. 1, 5, 8, or 13, and including two SAW filters, namely a fourth SAW, F4, and a fifth SAW, F5, (not shown).

Figure 13:
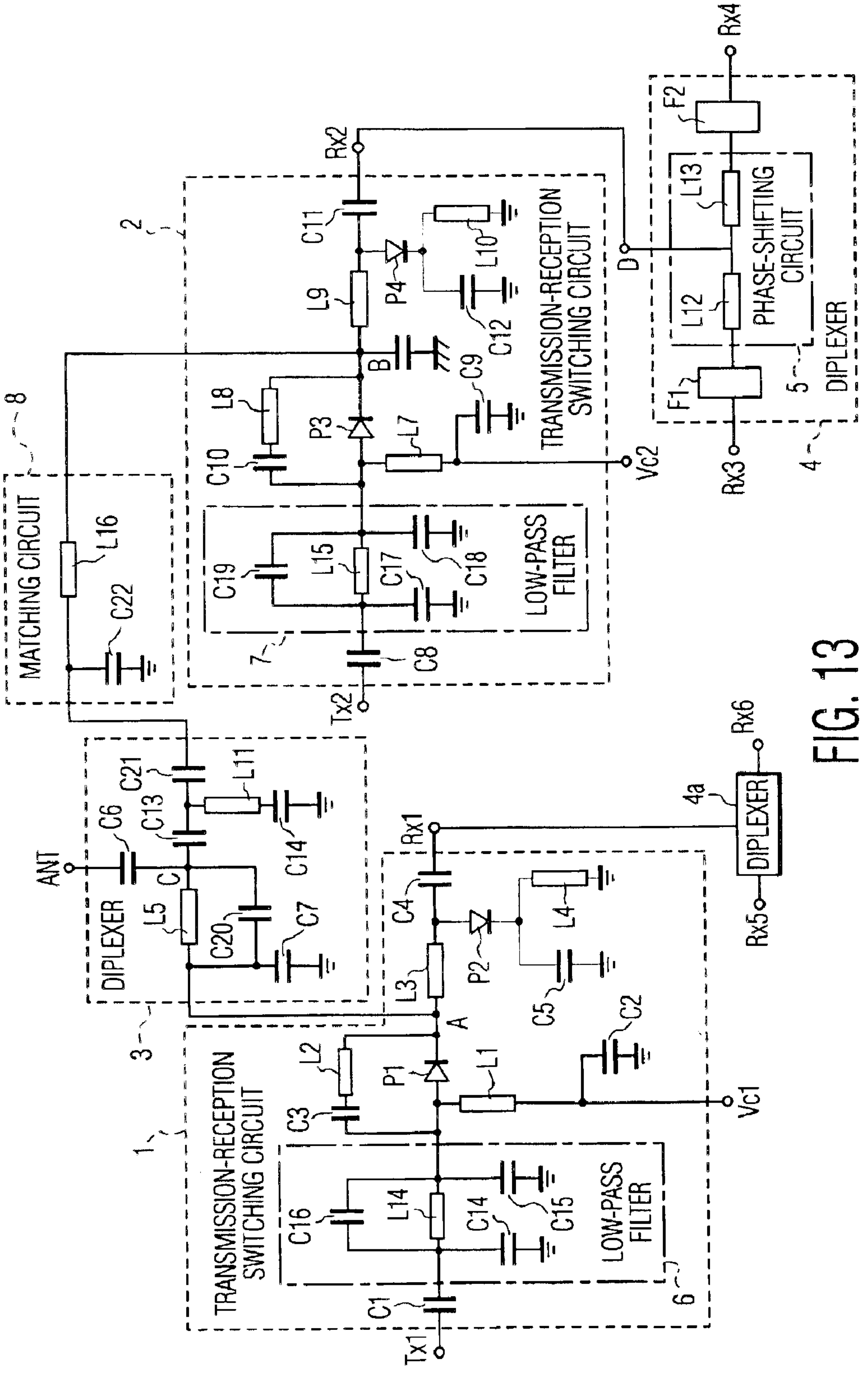
FIG. 13 is a circuit diagram of a high-frequency switch including an additional diplexer, having a phase shift circuit and saw filters, in accordance with an embodiment of the invention.

FIG. 13 shows a block diagram of a high-frequency switch that includes components shown in FIG. 1 and the third diplexer, designated as 4*a* (described in the previous paragraph), As shown, third diplexer 4*a* selectively switches the signal at Rx1 to the fifth receiving-circuit Rx5 and the sixth receiving-circuit Rx6.

Of course, the present invention includes a high-frequency radio unit provided with a transmitting circuit for performing transmission, a receiving circuit for performing reception, and the above high-frequency switch.

As described above, a high-frequency switch of the present invention has the following advantages.

It is possible to reduce two diodes and decrease the component mounting area of the surface layer of a switching device.

Moreover, no control input is necessary for a second diplexer, no standby current for turning on a diode under reception standby is necessary, and power consumption is reduced.

By using a balun, it is possible to reduce a capacity for DC cutoff connected to a receiving-circuit terminal. Moreover, by using a balun and thereby obtaining a balanced output, it is possible to realize a circuit strong for noises.

As described above, the present invention has an advantage that it is possible to reduce the number of components to be mounted on the surface of the laminated substrate of a high-frequency switch.

Moreover, the present invention has an advantage that it is possible to reduce the power consumption of a high-frequency switch.

DESCRIPTION OF SYMBOL

1,11 . . . First transmission-reception switching circuit
2,12 . . . Second transmission-reception switching circuit
3,13 . . . First diplexer
4 . . . Second diplexer
5 . . . Phase-shifting circuit
6,7 . . . Low-pass filter
8 . . . Matching circuit
14 . . . Auxiliary switching circuit
21 . . . Laminated high-frequency switch
21B4, 21B10, 21C4, 21C10 . . . Via hole
ANT . . . Antenna terminal
BL1–BL3 . . . Balanced-to-unbalanced converter (Balun)
C1–C28 . . . Capacitor
E . . . Earth electrode
F1–F3 . . . Surface-acoustic-wave filter (SAW filter)
L1–L20 . . . Strip line
P1–P6 . . . Diode
Rx1–Rx4 . . . Receiving-circuit terminal
Tx1–Tx2 . . . Transmitting-circuit terminal
Vc1–Vc3 . . . Control terminal

What is claimed is:

1. A high-frequency switch comprising:

a first transmission-reception switching circuit for selectively switching between a signal transfer between an antenna terminal and a first transmitting-circuit terminal and a signal transfer between the antenna terminal and a first receiving-circuit terminal;

a second transmission-reception switching circuit for selectively switching between a signal transfer between the antenna terminal and a second transmitting-circuit terminal and a signal transfer between the antenna terminal and a second receiving-circuit terminal;

a first diplexer disposed between the antenna terminal and the first transmission-reception switching circuit and between the antenna terminal and the second transmission-reception switching circuit; and a second diplexer connected to the second receiving-circuit terminal to selectively switch a signal transfer between the second receiving-circuit terminal and a third receiving-circuit terminal and a signal transfer between the second receiving-circuit terminal and a fourth receiving-circuit terminal by using a phase-shifting circuit and a surface-acoustic-wave filter, a third diplexer connected to the first receiving-circuit terminal in order to selectively switch a signal transfer between the first receiving-circuit terminal and a fifth receiving-circuit terminal and a signal transfer between the first receiving-circuit terminal and a sixth receiving-circuit terminal, the third diplexer including a phase-shifting circuit and a surface-acoustic-wave filter, wherein the first diplexer has a low-pass filter disposed between the antenna terminal and the first transmission-reception switching circuit and a high-pass filter disposed between the antenna terminal and the second transmission-reception switching circuit.

2. The high-frequency switch according to claim 1, wherein the first transmission-reception switching circuit has a first diode having an anode connected to the first transmitting-circuit terminal and a cathode connected to the low-pass filter, a first strip line connected at one end to the anode of the first diode and grounded at the other end through a first capacitor and connected to a first control terminal, a second diode having an anode connected to the first receiving-circuit terminal and a cathode grounded through a parallel circuit constituted by a second capacitor and a second strip line, and a third strip line connected at one end to the anode of the second diode and connected at the other end to the low-pass filter;

the second transmission-reception switching circuit has a third diode having an anode connected to the second transmitting-circuit terminal and a cathode connected to the high-pass filter, a fourth strip line connected at one end to the anode of the third diode and grounded at the other end through a third capacitor and connected to a second control terminal, a fourth diode having an anode connected to the second receiving-circuit terminal and a cathode grounded through a parallel circuit constituted by a fourth capacitor and a fifth strip line, and a sixth strip line connected at one end to the anode of the fourth diode and connected at the other end to the high-pass filter;

the second diplexer has a first phase shifting circuit whose input terminal is connected to the second receiving-circuit terminal whose first output terminal is connected to a third receiving-circuit terminal through a first surface-acoustic-wave filter, and whose second output terminal is connected to a fourth receiving-circuit terminal through a second surface-acoustic-wave filter; and transmission and reception are switched in accordance with a voltage applied to the first or second control terminal.

3. The high-frequency switch according to claim 2, further comprising:

a first balanced-to-unbalanced converter disposed between the first output terminal of the first phase-shifting circuit and the first surface-acoustic-wave filter; and a second balanced-to-unbalanced converter disposed between the second output terminal of the first phase-shifting circuit and the second surface-acoustic-wave filter.

4. The high-frequency switch according to claim 2, further comprising:

a third balanced-to-unbalanced converter disposed between the anode of the second diode and the first receiving-circuit terminal; and third surface-acoustic-wave filter disposed on the output side of the third balanced-to-unbalanced converter.

5. The high-frequency switch according to claim 2, wherein the first phase-shifting circuit has a seventh strip line connected at one end to the second receiving-circuit terminal and connected at the other end to the first surface-acoustic-wave filter, a fifth capacitor connected at one end to the second receiving-circuit terminal and grounded at the other end through a first inductor, and a sixth capacitor grounded at one end through the first inductor and connected to the fifth capacitor and connected at the other end to the second surface-acoustic-wave filter.

6. The high-frequency switch according to claim 2, wherein the first phase-shifting circuit has a second inductor aground at one end through a seventh capacitor and connected to the second receiving-circuit terminal and connected at the other end to the first surface-acoustic-wave filter, an eighth capacitor connected at one end to the second receiving circuit terminal and grounded at the other end through a third inductor, and a ninth capacitor grounded at one end through the third inductor and connected to the eighth capacitor and connected at the other end to the second surface-acoustic-wave filter.

7. The high-frequency switch according to claim 2, wherein the third diplexer has a second phase-shifting circuit whose input terminal is connected to the first receiving-circuit terminal, whose first output terminal is connected to a fifth receiving-circuit terminal through a fourth surface-acoustic-wave filter, and whose second output terminal is connected to a sixth receiving-circuit terminal through a fifth surface-acoustic-wave filter.

8. The high-frequency switch according to claim 7, wherein the second phase-shifting circuit has an eighth strip line connected at one end to the first receiving-circuit terminal and connected at the other end to the fourth surface-acoustic-wave filter, a tenth capacitor connected at one end to the first receiving-circuit terminal and grounded at the other end through a fourth inductor, and an eleventh capacitor grounded at one end through the fourth inductor and connected to the tenth capacitor and connected at the other end to the fifth surface-acoustic-wave filter.

9. The high-frequency switch according to claim 7, wherein the second chase-shifting circuit has an fifth inductor grounded at one end through a twelfth capacitor and connected to the first receiving-circuit terminal and connected at the other end to the fourth surface-acoustic-wave filter, a thirteenth capacitor connected at one end to the first receiving-circuit terminal and grounded at the other end through a sixth inductor, and a fourteenth capacitor grounded at one end through the sixth inductor and connected to the thirteenth capacitor and connected at the other end to fifth surface-acoustic wave filter.

* * * * *

UNITED STATES PATENT AND TRADEMARK OFFICE

CERTIFICATE OF CORRECTION

PATENT NO. : 6,867,662 B2 
DATED : March 15, 2005
INVENTOR(S) : Kazuhide Uriu et al.

It is certified that error appears in the above-identified patent and that said Letters Patent is hereby corrected as shown below:

Title page,
Item [75], Inventors, “Katano” (both occurrences) should read -- Osaka --, and “Joyo” should read -- Kyoto --.

Column 19,
Line 48, insert -- , -- after “terminal”.

Column 20,
Line 6, insert -- a -- before “third”.
Line 23, “aground” should read -- grounded --.

Signed and Sealed this

Thirteenth Day of September, 2005

JON W. DUDAS
*Director of the United States Patent and Trademark Office*